(12) United States Patent
Werner et al.

(10) Patent No.: US 9,830,409 B2
(45) Date of Patent: Nov. 28, 2017

(54) ELECTROMAGNETIC BAND GAP STRUCTURE AND METHOD FOR ENHANCING THE FUNCTIONALITY OF ELECTROMAGNETIC BAND GAP STRUCTURES

(71) Applicants: Douglas H. Werner, State College, PA (US); Spencer Martin, Melbourne, FL (US); Erik Lier, Newtown, PA (US); Matthew Bray, Newtown, PA (US)

(72) Inventors: Douglas H. Werner, State College, PA (US); Spencer Martin, Melbourne, FL (US); Erik Lier, Newtown, PA (US); Matthew Bray, Newtown, PA (US)

(73) Assignees: The Penn State Research Foundation, University Park, PA (US); Lockheed Martin Corporation, Bethesda, MD (US)

( * ) Notice: Subject to any disclaimer, the term of this patent is extended or adjusted under 35 U.S.C. 154(b) by 912 days.

(21) Appl. No.: 13/858,247

(22) Filed: Apr. 8, 2013

(65) Prior Publication Data
US 2013/0268250 A1 Oct. 10, 2013

Related U.S. Application Data

(60) Provisional application No. 61/622,068, filed on Apr. 10, 2012.

(51) Int. Cl.
*G06F 17/50* (2006.01)
*H01Q 15/02* (2006.01)
(Continued)

(52) U.S. Cl.
CPC ...... *G06F 17/5009* (2013.01); *G06F 17/5036* (2013.01); *H01Q 15/0066* (2013.01);
(Continued)

(58) Field of Classification Search
None
See application file for complete search history.

(56) References Cited

U.S. PATENT DOCUMENTS 7,437,693 B1 * 10/2008 Somaya et al. ............... 716/136
7,761,276 B1 * 7/2010 Degerstrom ........ G06F 17/5036
703/14
(Continued)

OTHER PUBLICATIONS

F. Bayatpur, "Metamaterial-Inspired Frequency-Selective Surfaces", pp. 1-172, 2009.*
(Continued)

*Primary Examiner* — Kibrom K Gebresilassie
(74) *Attorney, Agent, or Firm* — Buchanan Ingersoll & Rooney PC

(57) ABSTRACT

A method for making an electromagnetic band gap structure includes performing a single full wave simulation for the structure using a computer to perform the simulation, extracting a multiple port scattering matrix based on the single full wave simulation using a computer, and measuring or estimating a transmission of waves across the body between a first port and a second port of the body. The body has multiple ports between the first port and the second port that are defined by scattering elements using the computer. The matrix may be reduced to a two by two matrix recursively one dimension at a time using the computer.

19 Claims, 12 Drawing Sheets

(51) Int. Cl.
  H01Q 15/00 (2006.01)
  *H01Q 1/52* (2006.01)
  *G06F 17/12* (2006.01)
  *H04B 1/40* (2015.01)

(52) U.S. Cl.
  CPC ............ *H01Q 15/02* (2013.01); *G06F 17/12* (2013.01); *G06F 17/5063* (2013.01); *H01Q 1/521* (2013.01); *H04B 1/40* (2013.01); *H04B 2203/5425* (2013.01); *H04B 2203/5483* (2013.01); *H05K 2201/09618* (2013.01)

(56) References Cited

U.S. PATENT DOCUMENTS

| | | | | |
|---|---|---|---|---|
| 8,386,216 | B1* | 2/2013 | Al-Hawari et al. | 703/2 |
| 8,938,372 | B1* | 1/2015 | Petersson et al. | |
| 9,063,882 | B1* | 6/2015 | Zhao | |
| 2003/0065498 | A1* | 4/2003 | Bois et al. | 703/19 |
| 2005/0102343 | A1* | 5/2005 | Tsang et al. | 708/446 |
| 2008/0093112 | A1* | 4/2008 | Kushta | 174/260 |
| 2009/0234631 | A1* | 9/2009 | Stevens et al. | 703/14 |
| 2011/0178748 | A1* | 7/2011 | Shlepnev | 702/65 |
| 2012/0139810 | A1* | 6/2012 | Faraone et al. | 343/850 |
| 2012/0163691 | A1* | 6/2012 | Walker et al. | 382/131 |
| 2012/0254811 | A1* | 10/2012 | Su et al. | 716/52 |
| 2013/0241785 | A1* | 9/2013 | De Flaviis | H01Q 13/10 343/767 |
| 2014/0032190 | A1* | 1/2014 | Shlepnev | 703/2 |
| 2014/0148017 | A1* | 5/2014 | Adams et al. | 438/795 |
| 2014/0287703 | A1* | 9/2014 | Herbsommer et al. | 455/90.2 |
| 2016/0181681 | A1* | 6/2016 | Sarabandi | H01P 1/025 333/21 R |

OTHER PUBLICATIONS

F. Bayatpur, "Metamaterial-Inspired Frequency-Selective Surfaces" 2009, 172 pages.*
H. C. Lu, T. H. Chu, "Port Reduction Methods for Scatting Matrix Measurement of an n-Port Network", pp. 959-968, IEEE 2000.*
L. Liang, C. H. Liang, X. W. Zhao, and Z. Su, "A novel broadband EBG using multi-period mushroom-like structure," International Conference on Microwave and Millimeter Wave Technology, 2008, ICMMT 2008, vol. 4, pp. 1609-1612, Apr. 21-24, 2008.
W. Zhang, C. H. Liang, T. H. Ding, and B. Wu, "A novel broadband EBG using multi-via cascaded mushroom-like structure," Microwave Conference, APMC 2009, Asia Pacific, pp. 484-487, Dec. 7-10, 2009.
N. Hansen and A. Ostermeier, "Completely derandomized self-adaptation in evolution strategies," Evolutionary Computation, vol. 9, No. 2, pp. 159-195, 2001.
M. D. Gregory, Z. Bayraktar, and D. H. Werner, "Fast optimization of electromagnetic design problems using the covariance matrix adaptation evolutionary strategy," IEEE Transactions on Antennas and Propagation, vol. 59, No. 4, pp. 1275-1285, Apr. 2011.
D. Sievenpiper, L. Zhang; R. F. J Broas, N. G. Alexopolous, and E. Yablonovitch, "High-impedance electromagnetic surfaces with a forbidden frequency band," IEEE Transactions on Microwave Theory and Techniques, vol. 47, No. 11, pp. 2059-2074, Nov. 1999.
M. Davidovitz, "Reconstruction of the S-matrix for a 3-port using measurements at only two ports," IEEE Microwave and Guided Wave Letters, vol. 5, No. 10, pp. 349-350, Oct. 1995.
H. C. Lu, and T. H. Chu, "Port reduction methods for scattering matrix measurement of an n-port network," IEEE Transactions on Microwave Theory and Techniques, vol. 48, No. 6, pp. 959-968, Jun. 2000.

* cited by examiner

ELECTROMAGNETIC BAND GAP STRUCTURE AND METHOD FOR ENHANCING THE FUNCTIONALITY OF ELECTROMAGNETIC BAND GAP STRUCTURES

CROSS-REFERENCE TO RELATED APPLICATIONS

The present application claims priority to U.S. Provisional Patent Application No. 61/622,068, which was filed on Apr. 10, 2012. The entirety of U.S. Provisional Patent Application No. 61/622,068 is incorporated by reference herein.

FIELD OF INVENTION

The present invention relates to electromagnetic band gap structures, antenna systems that utilize at least one electromagnetic band gap structure and methods of making, designing and enhancing such electromagnetic band gap structures.

BACKGROUND OF THE INVENTION

In many antenna systems, the ability to control mutual coupling between elements in an antenna array or between separate arrays is often of critical importance. As many antenna systems need to be operable over a broad frequency range, such coupling of elements must also be maintained over a broad frequency range to meet design objectives. Undesired coupling can cause performance degradation or even damage to the underlying hardware of an antenna system. To mitigate this problem, a compact structure which can be utilized to control surface wave propagation and reduce coupling between elements is usually needed.

The most common method used for reducing the propagation of surface waves, so that undesired coupling can be avoided is the use of electromagnetic band gap (EBG) structures in between the elements of interest. EBG structures are typically designed as compact and conformal structures made of periodic metal and dielectric structures to provide a frequency range in which no surface waves can propagate, this effectively puts a gap in the band of allowed surface wave modes. The creation of the band gap caused by the EBG structure acts to essentially eliminate coupling.

One of the earliest example of an EBG structures consisted of a doubly periodic array of simple metallic patches connected to a ground plane by vias (the unit cells of the EBG are sometimes referred to as mushroom-type or mushroom-like structures). In a limited frequency range, this structure has a very high impedance.

Due to the bandwidth limitation of this structure, different methods have been proposed to improve the frequency range over which EBG performance can be realized. The primary method that has been used to improve bandwidth is cascading multiple EBG structures, each targeting a different frequency band. Each section of the cascaded structure is composed of differently sized unit cells that correspond to a different target frequency range. If the unit cell sizes are strategically chosen, their respective bands can be designed to overlap with one another to form a single device with a broader bandwidth of operation. However, use of multiple cascaded sections requires a system that is very large due to the need for a sub-structure to cover each frequency range. Compact structures are typically not available for designs using such an EBG structure. Since space available for an antenna system is often limited, the inability to utilize a compact structure is often a negative feature for such EBG designs.

Another method that has been used is to modify the path to ground from the mushroom structure in each section. This effectively changes the inductance and therefore changes the resonant frequency of the circuit, resulting in similar control over the frequency range of operation as previously described with respect to the cascaded section EBG design. Because it is difficult to increase the inductance of this basic structure, it is necessary to lower the inductance. This leads to the modified frequency range being at a higher frequency than the original structure, therefore the size of the structure relative to wavelength is not reduced at the lower end of the frequency band.

A new EBG structure is needed that permits the use of a compact structure that also provides improved bandwidth. Preferably, such a new structure permits use of a design methodology that makes it possible to relatively quickly design a desired EBG structure that meets design objectives for an antenna system by circumventing of a need to perform a full wave simulation each time an EBG surface is changed or configured during the design of the structure.

SUMMARY OF THE INVENTION

A method for making or designing an electromagnetic band gap structure includes performing a single full wave simulation for the structure using a computer to perform the simulation, extracting a multiple port scattering matrix based on the single full wave simulation using a computer, and measuring or estimating a transmission of waves across the body between a first port and a second port of the body. The body has multiple ports between the first port and the second port that are defined by scattering elements using the computer. The matrix may be reduced to a two by two matrix recursively one dimension at a time using the computer.

Electromagnetic band gap structures are also provided that may be designed based on an embodiment of our method and fabricated using an embodiment our method. For instance, an electromagnetic band structure may comprise a body defining a plurality of unit cells. Each of the unit cells comprise a metallic patch. A plurality of scattering elements are included in the electromagnetic band structure. Each scattering element is positioned between two of the cells to create a predetermined scattering effect between the cells the scattering element is positioned between.

Each of the scattering elements may have at least one scattering parameter that is defined to generate the predetermined scattering effect. At least one scattering parameter may be defined by use of a method comprising: performing a single full wave simulation, extracting a multiple port scattering matrix based on the single full wave simulation, measuring or estimating a transmission of waves across the body between a first port and a second port of the body where the body has multiple ports, and reducing the matrix to a two by two matrix recursively one dimension at a time. In some embodiments of the method, reducing the matrix to a two by two matrix recursively one dimension at a time utilizes the below formula:

$$S_{ij}^{(k)} = \frac{S_{ik} S_{kj} \Gamma_k}{1 - S_{kk} \Gamma_k}$$

where $\Gamma_k$ is the reflection coefficient from a two-port circuit with the output pins shorted, $S_{ij}^{(k)}$ is an element of the new scattering matrix after substitution of a circuit defined by a respective one of the scattering elements, and remaining terms are elements of the scattering matrix before the substitution.

Embodiments of the electromagnetic band structure can be configured so that the body has a plurality of apertures. Each of the apertures may be positioned between immediately adjacent unit cells so that the apertures space the unit cells from each other. The scattering elements may each be comprised of a metallic structure and each of the scattering elements may be positioned in or above a respective one of the apertures. For instance, in some embodiments, the body of the electromagnetic structure may have a plurality of gaps, channels or grooves that separate the unit cells. Each gap, channel or groove can be positioned between immediately adjacent metallic patches of immediately adjacent unit cells to space the metallic patches from each other and the scattering elements may be capacitors, inductors, resistors, or any combination thereof that are each positioned in or above a respective one of the gaps, channels or grooves.

A method for making an electromagnetic band gap structure may include performing a single full wave simulation for the structure using a computer to perform the simulation; extracting a multiple port scattering matrix based on the single full wave simulation using the computer, and measuring or estimating a transmission of waves across the body between a first port and a second port of the body. The body may have multiple ports between the first port and the second port that are defined by scattering elements using the computer. The method may also include the step of reducing the matrix to a two by two matrix recursively one dimension at a time using a computer.

The reducing the matrix to a two by two matrix recursively one dimension at a time may utilize the formula:

$$S_{ij}^{(k)} = \frac{S_{ik} S_{kj} \Gamma_k}{1 - S_{kk} \Gamma_k}$$

where $\Gamma_k$ is the reflection coefficient from a two-port circuit with the output pins shorted, $S_{ij}^{(k)}$ is an element of the new scattering matrix after substitution of a circuit defined by a respective one of the scattering elements, and remaining terms are elements of the scattering matrix before the substitution.

The method may also include additional steps. For example, the method may include the step of including the structure in an antenna system.

As another example, the method may include making the structure. The structure may include a body defining a plurality of unit cells and a plurality of scattering elements. Each scattering element is positioned between two of the unit cells to create a capacitive load between the cells the scattering element is positioned between. Each of the scattering elements may have at least one scattering parameter.

In some embodiments of the structure, the body may have a plurality of apertures. Each of the apertures may be positioned between immediately adjacent unit cells so that the apertures space the unit cells from each other. The scattering elements may each be comprised of a metallic structure and each of the scattering elements may be positioned in or above a respective one of the apertures. For example, the body may have a plurality of gaps, channels or grooves that separate the unit cells that are each positioned between immediately adjacent unit cells to space the unit cells from each other and the scattering elements may be capacitors that are each positioned in or above a respective one of the gaps, channels or grooves.

In some embodiments of the method, the method maybe performed such that a full wave simulation is not performed after the single full wave simulation is performed using the computer. For instance, in some embodiments of the method the reducing of the matrix to a two by two matrix is performed utilizing a port substitution technique such that only the single full wave simulation is performed and no other full wave simulations are performed to design the electromagnetic band gap structure.

The computer that may be utilized in embodiments of the method may be one computer or may be a plurality of interconnected computers that form a computer device. The computer may be, for example, at least one computer device, a server, a work station, a laptop computer, a tablet computer device, a mobile computer communicatively coupled to a server hosting a service, a plurality of interconnected computer devices, a computer communicatively coupled to a server hosting a service, or a desktop computer.

Other details, objects, and advantages of the invention will become apparent as the following description of certain present preferred embodiments thereof and certain present preferred methods of practicing the same proceeds.

BRIEF DESCRIPTION OF THE DRAWINGS

Present preferred embodiments of EBG structures and antenna systems utilizing such structures are shown in the accompanying drawings. It should be appreciated that like reference numbers used in the drawings may identify like components.

DETAILED DESCRIPTION OF PRESENT PREFERRED EMBODIMENTS

Figure 1:
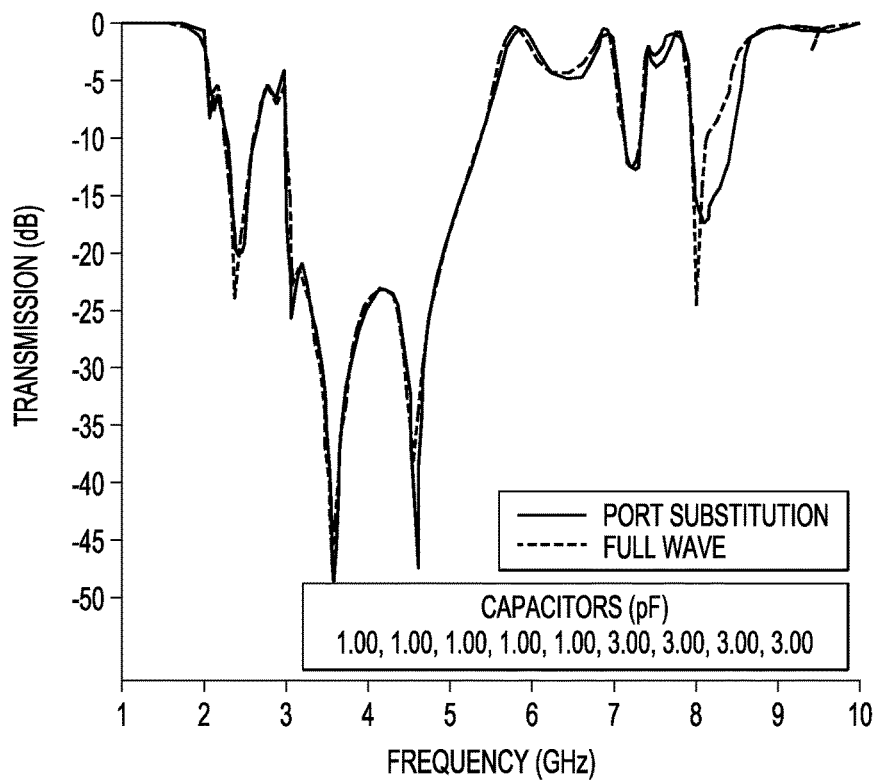
FIG. 1 is a graph comparing a full wave simulation and the results of such a simulation using an embodiment of the substitution method. Capacitances are listed as used in both methods.
Figure 2A:
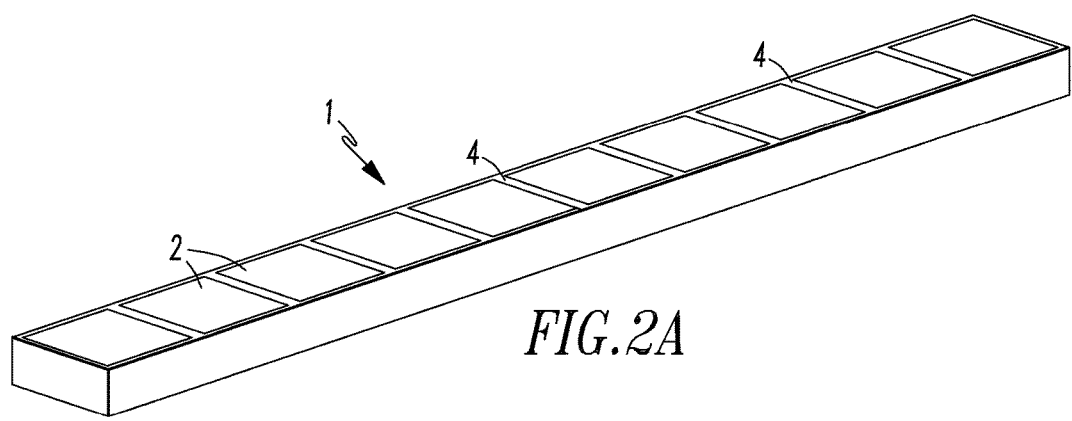
FIG. 2A is a perspective view of an electromagnetic band gap structure prior to capacitors being attached thereto to provide a desired scattering affect.
Figure 2B:
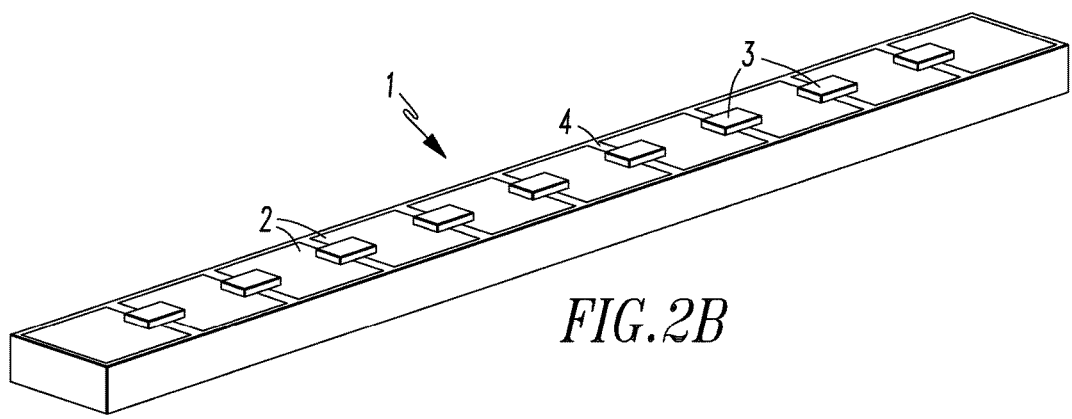
FIG. 2B is a perspective view of an exemplary electromagnetic band gap structure that utilizes the structure of the EBG shown in FIG. 2A but includes capacitors attached thereto to provide a desired scattering effect.

Referring to FIGS. 1-2B, an embodiment of our electromagnetic band gap structure 1 for inclusion in an antenna system or antenna assembly is shown in FIG. 2B. An image of the underlying structure prior to inclusion of scattering elements sized and configured to provide a desired scattering effect is shown in FIG. 2A. The underlying structure contains a plurality of identical unit cells 2. Each unit cell includes a metallic patch and a via. The metallic patch 2a of each unit cell 2 is separated by a gap, groove or channel 4.

The scattering elements included in the embodiment of the EBG structure shown in FIG. 2B are capacitors 3 that are positioned between different metallic patches 2 of the electromagnetic band gap structure 1 to provide a desired scattering effect. Each of the capacitors 3 extend from one metallic patch over the gap, channel, or other type of aperture 4 and to an immediately adjacent unit cell. It is also contemplated that at least a portion of each capacitor could be positioned within a respective one of the apertures 4.

In some alternative embodiments, the capacitors could be replaced with inductors. It is also contemplated that active circuits, interdigitated metallic structures, or multi-element circuits could be used. In yet another contemplated alternative embodiment, the scattering elements could include capacitors, interdigitated metallic structures, inductors, active circuits and multi-element circuits positioned between different metallic patches 2a.

The scattering parameters provided by the capacitors 3 depend upon the size and shape of the capacitors as well as their capacitance. The design of the embodiment of FIG. 2B was optimized based upon the underlying structure of FIG. 2A for configuration and design of the positioning and size of the capacitors to meet a desired design objective The method by which the position, size and capacitance of the capacitors were determined did not utilize multiple repetitive uses of a full wave simulation. Instead, an embodiment of our method, which permits optimization of a design to be fully assessed much more quickly, was utilized for designing the EBG structure illustrated in FIG. 2B.

An embodiment of the method for improving the bandwidth of these structures was based upon the simple circuit model. The method includes the step of adding small sections with predefined scattering parameters to an electromagnetic band structure. The small sections are assigned scattering parameters which may represent any scattering element. The scattering elements may be sized and configured to have physical significance that contributes to the scattering parameters of those elements and are positioned between the unit cells of the underlying structure. The underlying structure may be a circuit board, a silicon wafer based structure, a semiconductor, a microstrip, a strip of material, a part of an antenna, or an antenna body portion.

The scattering parameters of the scattering elements can be defined to represent any two-port network, such as single circuit elements like capacitors or inductors or more complicated circuits. The scattering elements may be, for example, metallic structures, inductors or capacitors positioned between unit cells.

For example, the scattering parameters of the scattering elements may be chosen to represent a unique capacitance between each unit cell. Capacitors as a scattering element may be preferred because capacitors are easily implemented in manufacturing and have a greater effect on the properties of this type of surface than inductors do. Because each capacitance can be arbitrarily chosen within practical limits, this approach can provide more degrees of freedom that allow a designer to precisely control the frequency range and bandwidth of an EBG structure, or EBG device.

The scattering parameters that should be used to obtain optimal performance may be determined as well. The scattering parameters may include, for example, the capacitance value for each capacitor, or the size and shape of a particular metallic structure to provide a desired capacitive load between unit cells. The determination of the scattering parameters may utilize a port substitution technique in conjunction with a robust global optimization procedure (e.g., genetic algorithms, particle swarm optimization, covariance matrix adaptation evolutionary strategy, etc.) to meet the desired design goals. Using this design methodology, the necessary scattering parameters, which may be limited to physically realizable circuits, needed between each unit cell to properly modify the structure and meet a targeted set of performance goals can be efficiently calculated.

The port substitution technique is what facilitates the efficient optimization procedure. Optimizations using standard full-wave solvers may require weeks or even months to complete because each function evaluation would take up to as much as several hours to calculate by a computer device such as a work station or desktop computer having memory and at least one processor unit for processing an application stored on the memory to perform such calculations.

Lumped ports are used instead of lumped elements to represent the circuit that connect the unit cells. By doing this, only a single full-wave simulation is required. From this simulation an N-port scattering matrix can be extracted, manipulated, and efficiently used as a template and starting point for performing numerous calculations and optimizations.

The first two ports are the normal ports used to measure the transmission of waves across the structure. The remaining N-2 ports (e.g. N minus two ports) represent each of the circuits added between the unit cells. Given an appropriate number of circuits to be substituted, the input-to-output two-port properties can be extracted from the results of this simulation. To do this, the full matrix must be reduced from an N×N to a 2×2. This requires that the matrix be recursively reduced one dimension at a time. This reduction is accomplished by employing the following formula:

$$S_{ij}^{(k)} = \frac{S_{ik} S_{kj} \Gamma_k}{1 - S_{kk} \Gamma_k}$$

where $\Gamma_k$ is the reflection coefficient from the two-port circuit with the output pins shorted. $S_{ij}^{(k)}$ is an element of the new scattering matrix after substitution of the circuit, and the remaining terms are elements of the scattering matrix before the substitution.

After substituting all of the circuits, only a two-by-two matrix remains, which represents the scattering parameters from the two-port structure with all of the circuits placed between adjacent unit cells. The entire port reduction process takes fractions of a second as opposed to the hours that a single full-wave simulation may require. Owing to this speed improvement, the port substitution method can be easily integrated into an optimization procedure, which would pick appropriate circuits based on the desired performance objectives of the EBG structure.

The calculation may be made by a program stored on memory of a computer. A processor of the computer may run the program to perform the calculation. Data may be input by one or more input devices coupled to the computer. Examples of such input devices include a keyboard, mouse, data stored on memory, data from a database, or data provided by another input device. As another example, the computer may be a server that hosts the service and uses input that may be provided via a computer device communicatively coupled to the server for using the service hosted by the server.

Capacitors are contemplated as having a stronger effect on the surfaces of the EBG structure than other elements. Therefore to simplify the design and fabrication procedures while simultaneously introducing the greatest level of control, capacitors were considered as the preferable scattering elements. However, as pointed out earlier, any type of circuit element could be used, for instance inductors, metallic structures, or other elements that may provide a desired scattering parameter between unit cells.

Figure 8:
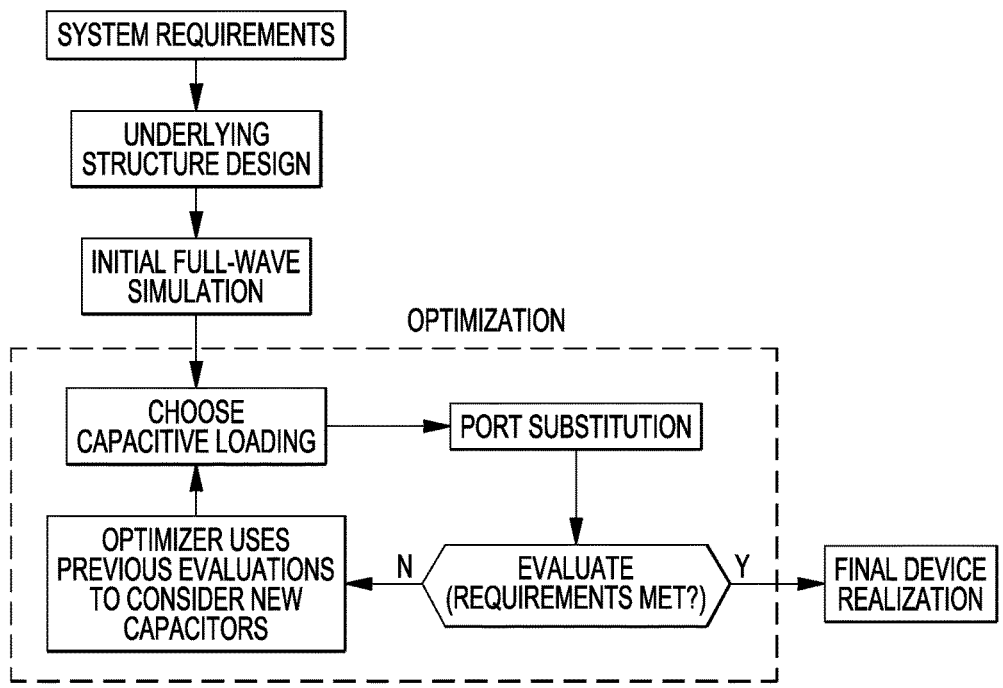
FIG. 8 is a flow chart illustrating a present preferred method of designing and fabricating an EBG structure.

To provide a more explicit example of the utilization of the above mentioned method, below will describe an example of an implementation of this method to result in a design of an EBG structure that may subsequently be fabricated based on the optimized design. A flow chart illustrating this method may be seen in FIG. 8 and a graph illustrating the improvement obtained by the optimization of the structure as provided by utilization of the method for this particular example may be seen in FIG. 9.

The design can be thought to consist of two parts; the first is the design of the underlying structure and the second part of the design is the optimization of the additional loading. In both of these parts, the final objectives and constraints must be considered in various ways. The first step in the process is to determine what the objective of the system will be. For this example, the objective will be to optimize a structure with the largest bandwidth in the frequency range immediately below 7 GHz. By adding capacitive loading between the unit cells, or metallic patches of the unit cells, the resonant frequency will shift downward and therefore the underlying structure may determine what the maximum frequency of operation will be. In order to set a frequency range ending at approximately 7 GHz, the underlying structure will be chosen such that the unit cells have a periodicity of 7 mm, a separation between metallic patches, such as metal plates, of 0.5 mm, a via radius of 12 mil, and the substrate is 1.52 mm thick with a permittivity of 3.02. A structure having 12 unit cells will be chosen for this particular design due to the available space within an antenna system in which the EBG device, or EBG structure, may be utilized.

The next step in the method is determining which methodology may be used to simulate or test the initial design of the structure via a full wave simulation. A simulation using any of a number of available full wave simulation methods that are commercially available may be selected for use. Such a full wave simulation may be software that is run on a computer, an example of which is HFSS software, which is sold by Ansys, Inc. For this example, a simulation that simulates the structure being placed in a parallel plate waveguide with transverse electromagnetic wave excitation may be used. Using the parallel plate waveguide as the initial simulation for this example will involve two wave ports at each end of the waveguide and eleven lumped ports in lieu of additional capacitive loading between each of the twelve unit cells.

Of course, alternative types of simulation models can be used to initialize the optimization procedure. Alternate simulations could include any common testing method currently used in industry or academia or may utilize a simulation of a full antenna systems with the EBG structures already integrated into the design. In order to simulate a full antenna system with an integrated EBG structure, much larger computational power is required as compared to the smaller simulations mentioned above, but the result would be an accurate representation of the final system.

After this initial full-wave simulation is completed the thirteen port scattering matrix must be extracted from the simulation software of the computer or work station on which the software is stored or used. Thereafter, an optimization step of our method may be used. We have chosen to use Covariance Matrix Adaptation Evolutionary Strategy, for this example because it has been shown to be extremely robust for real valued global optimizations. However, this is not the only optimization strategy that could be used. Other optimization methods that could be used include Genetic Algorithm (GA), Particle Swarm Optimization (PSO), or Non-dominated Sorted Genetic Algorithm (NSGA). Of course, there are also many more methodologies that could be used to efficiently calculate an optimized set of scattering elements to use to meet a particular design objective. For example, NSGA represents a set of optimization strategies that could be useful when multi-objective analysis is desirable. This branch of optimization techniques leaves this subjective question in the hands of the designer for later consideration. Because we are only interested in the bandwidth of the structure, implementation of the covariance matrix adaptation evolutionary strategy ("CMA-ES") methodology will perform the optimization effectively for this example.

The beginning of the optimization is also the time when the desired performance of the structure can be defined and any constraints for the design may be added. As mentioned above, the goal that will be used for optimization in this example is the broadest bandwidth possible. To achieve this we will allow the optimizer to select from a range of capacitors, but this is not the only possible set of elements that could be used for a structure such as this. One example of an optimizer that may be used is a computer program configured to utilize the port substitution calculation mentioned above in an iterative process. Such a computer program may be software that is stored on non-transitory memory and may be run via one or more processors of a computer or workstation that utilize parameters obtained from the full wave simulation. Those parameters may be manually input via a user utilizing an input device or be the computer program automatically retrieving such data from memory communicatively connected to the computer or data stored on memory of the computer by the full wave simulation software.

Examples of structures that could be used as scattering elements instead of capacitors include: inductors, multi-element circuits, or even active circuits. Each of these, and any other choices, would have drastically different effects on the total structure and would have their own set of benefits. For instance, active circuits or other active elements could be used to achieve a wide range of properties including tunable resonance, thereby changing the frequency range of operation.

For this specific example, we choose to only use capacitors because they lower the resonant frequency and have a large effect on these types of surfaces. The maximum frequency in the optimized band has already been determined by the underlying structure. There is also one additional constraint that we will add at this point; the capacitor values allowed in the optimization should be readily available from commercial retailers. This limits us to values up to 1.2 pF because above this value there are large gaps in the commonly available capacitors. Of course, in other uses of our method such a limitation may not be needed or used. For instance, some designers may want to use capacitors that are not readily available from different commercial suppliers or may use capacitors custom made for their developed design as needed to achieve a particular design objective.

Due to the fact that the maximum possible bandwidth is unknowable before the optimization is performed, the only completion criterion possible is for the improvement of the solutions from one generation to the next to approach zero. At this point the procedure is complete and the best set of capacitors based on the metrics of interest has been achieved. The results of this optimization can be seen in FIG. 9 as the line identified as Optimized, and the set of capacitors that have been selected are shown in the "Capacitors (pF)" key shown in FIG. 9 as well. The determined capacitors are 1.2 pF, 1.2 pF, 0.9 pF, 1.0 pF, 0.4 pF, 1.0 pF, 0.7 pF, 0.001 pF, 1.2 pF, 0.001 pF and 1.0 pF. Here the value of 0.001 pF refers to the natural capacitance of the underlying structure, which means that no lumped element or capacitor is needed in these locations. The response of the underlying structure, identified as the baseline line in FIG. 9, in the same test environment is also shown for reference.

Figure 9:
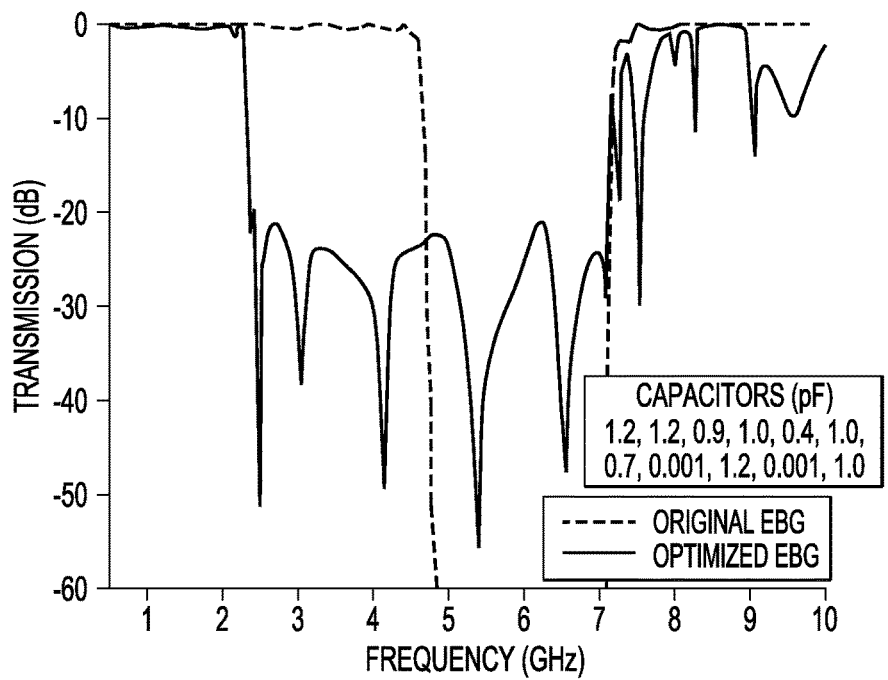
FIG. 9 is a graph illustrating the results of an exemplary optimization of an EBG structure.

It should be appreciated that the example of FIG. 9 targets the largest possible bandwidth of a twelve unit cell structure that has a bandwidth defined as a continuous frequency range with less than −20 dB of transmission. One further limitation that has been placed on this embodiment of our EBG structure for optimizing the structure utilizing an embodiment of our method is the allowed capacitance values. In order to make this particular embodiment of an EBG structure easily manufacturable, only capacitance values that can be readily purchased from commercial vendors have been used. The range of possible values used for this optimization spans from no capacitor at all (e.g. 0.001 pF values) to 1.2 pF. This value was chosen because it leads to a reasonably shifted response and many capacitor brands have large gaps in available values beyond this point.

With these considerations in mind the results shown in FIG. 9 were obtained. The optimizer created a structure that had transmission below −20 dB from approximately 2.4 GHz to 7.15 GHz, which is approximately 3:1 bandwidth. The value of 0.001 pF, shown in FIG. 9 allows the structure to behave as if there were no capacitor and therefore no capacitor is needed in these positions when the structure is manufactured. The original structure, without capacitors, has a stop band from three predefined wireless local area network ("WLAN") bands, which are highlighted here.

The trade-off of bandwidth for degree of isolation is an inevitable consequence of breaking the periodicity of the basic structure because the underlying structure consists of a single unit cascaded repeatedly. This creates a high order band-stop filter, which is characterized with deep stop-band with very sharp edges. Although the depth of the band has been reduced in the aperiodic case, −20 dB corresponds to a high level of isolation and is reasonable for many applications. Furthermore, because the frequency range has been extended to longer wavelengths, the structure corresponds to a much smaller length relative to wavelength at these frequencies. The capacitance values used to attain this response are shown in the lower right of FIG. 9.

As mentioned before, this method is largely possible due to the increased simulation speed made possible by port substitution as noted above. In this case each simulation using the port substitution method took less than a few seconds. Simulations with more ports will take slightly longer with this method, but the time scaling will not be as drastic as in the case of the full-wave simulation. This means that any simulation that can be run with a full-wave solver once can be optimized in a relatively small amount of time utilizing an embodiment of our method.

The entirety of the following articles are also incorporated by reference herein (1) L. Liang, C. H. Liang, X. W. Zhao, and Z. Su, "A novel broadband EBG using multi-period mushroom-like structure," International Conference on Microwave and Millimeter Wave Technology, 2008, ICMMT 2008, Vol. 4, pp. 1609-1612, 21-24 April 2008, (2) W. Zhang, C. H. Liang, T. H. Ding, and B. Wu, "A novel broadband EBG using multi-via cascaded mushroom-like structure," Microwave Conference, APMC 2009, Asia Pacific, pp. 484-487, 7-10 Dec. 2009, (3) N. Hansen and A. Ostermeier, "Completely derandomized self-adaptation in evolution strategies," Evolutionary Computation, Vol. 9, No. 2, pp. 159-195, 2001, (4) M. D. Gregory, Z. Bayraktar, and D. H. Werner, "Fast optimization of electromagnetic design problems using the covariance matrix adaptation evolutionary strategy," IEEE Transactions on Antennas and Propagation, Vol. 59, No. 4, pp. 1275-1285, April 2011, (5) D. Sievenpiper, L. Zhang; R. F. J Broas, N. G. Alexopolous, and E. Yablonovitch, "High-impedance electromagnetic surfaces with a forbidden frequency band," IEEE Transactions on Microwave Theory and Techniques, Vol. 47, No. 11, pp.

2059-2074, November 1999, (6) M. Davidovitz, "Reconstruction of the S-matrix for a 3-port using measurements at only two ports," IEEE Microwave and Guided Wave Letters, Vol. 5, No. 10, pp. 349-350, October 1995, and (7) H. C. Lu, and T. H. Chu, "Port reduction methods for scattering matrix measurement of an n-port network," IEEE Transactions on Microwave Theory and Techniques, Vol. 48, No. 6, pp. 959-968, June 2000.

Confirmation of this method's improvement in quickly designing an EBG structure to meet a particular design objective is provided in FIG. 1, which compares a full-wave simulation with 10 capacitively-loaded patches to its equivalent port reduction model. FIG. 2A shows the corresponding structure geometry before capacitors were added and FIG. 2B shows the structure after capacitors were added. All of the calculations shown here correspond to this type of structure placed in a parallel plate waveguide.

Figure 3:
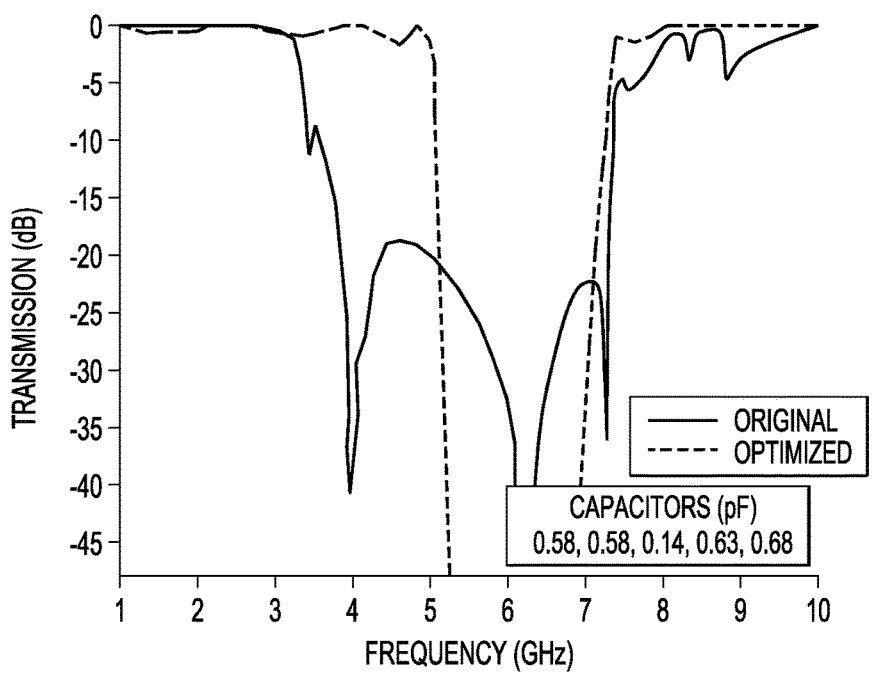
FIG. 3 is a graph comparing the baseline structure of FIG. 2A with an optimized structure of FIG. 2B that was optimized using an embodiment of our method.

FIG. 3 provides an example that illustrates the utility of this technique using six unit cells. The original case shown in hashed line of FIG. 3 corresponds to the mushroom-like structure without capacitors. The target of this design optimization was to achieve a stop band with at least 20 dB of suppression for the largest possible bandwidth. As may be seen from FIG. 3, the fractional bandwidth of the original structure is 35%, after optimization, which included positioning five capacitors in the structure, the fractional bandwidth of the structure is nearly 60%. Each of the capacitors is positioned between immediately adjacent unit cells and each capacitor has a specific capacitance value as shown in FIG. 3. The capacitance values were determined by use of an optimization method that utilized the port substitution method discussed above.

It should be noted that the result shown in FIG. 3 is only for six unit cells in a row; as more unit cells are added, the optimization has additional flexibility and even greater bandwidth can be achieved; whereas, the original structure does not gain any additional bandwidth with the addition of more unit cells.

Another important difference between the two results is in the time it takes to carry out the simulations. Both the initial simulation for the port substitution method and the full-wave simulation with lumped ports take approximately 35 minutes on a Dell Precision 690 desktop computer that utilizes two dual-core processors running at 3 GHz. The advantage of our method comes with subsequent optimization related simulations. Use of the full-wave simulation will take another 35 minutes to calculate for each new set of capacitors whereas the port substitution method takes approximately 0.15 seconds. This new method permits such simulations to occur approximately 14,000 times faster than conventional methods. This is a dramatic improvement and permits optimization of a design to occur much more quickly than prior art methodologies. For an optimization, thousands of function evaluations may be required, which would lead to a dramatic difference in computation time between the two methods.

Figure 4:
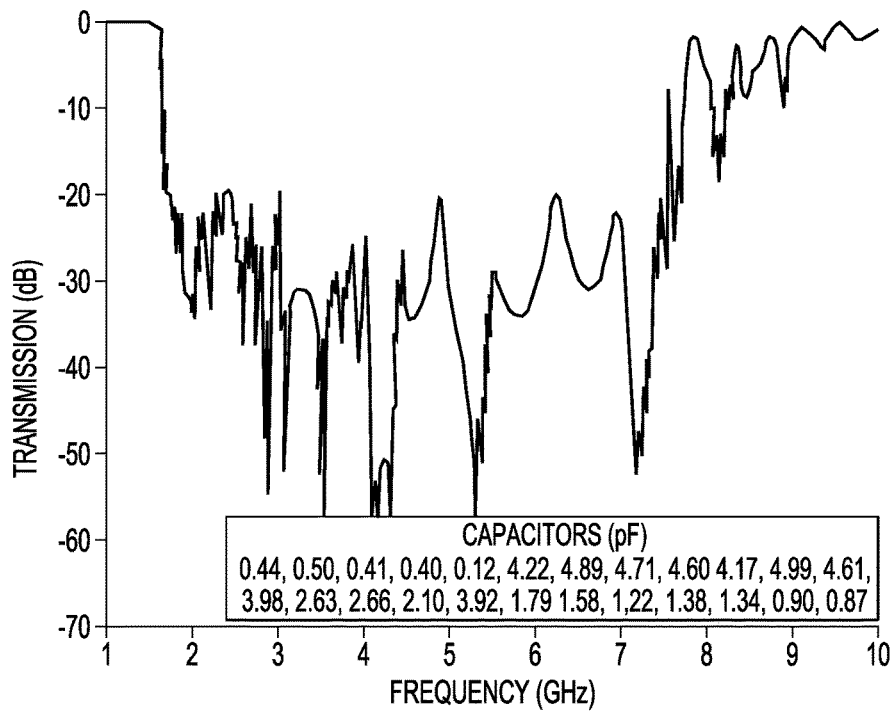
FIG. 4 is a graph of an ultra-wideband EBG designed using an embodiment of our port substitution and optimization method.

We have also optimized a design for a much broader bandwidth structure. The underlying structure for this embodiment included twenty-five patches, or unit cells. Each of these patches is connected to its neighboring patch by a capacitor. As may be appreciated from FIG. 4, there are a total of twenty-four capacitors as a capacitor is positioned between immediately adjacent unit cells, or patches, in series. This approach permits many more degrees of freedom to be available in the design when compared to conventional approaches. The result of this optimized design is shown in FIG. 4, which shows that the optimized design has a greater than 4 to 1 bandwidth ratio. The addition of capacitors reduces the resonant frequency of these structures; therefore the lower end of the stop band in this example is at a much lower frequency compared to the unmodified base structure. As a result, the structure size has been compressed relative to the wavelength, which is another advantage of our design technique.

Figure 6A:
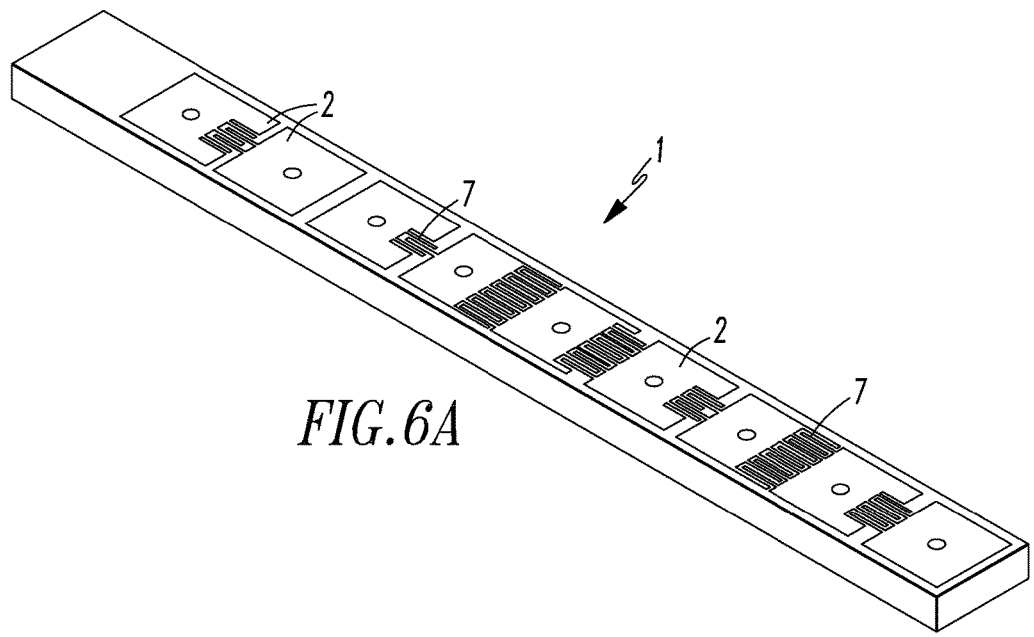
FIG. 6A is a perspective view of an exemplary embodiment of an EBG structure utilizing interdigitated metallic structures between unit cells.
Figure 6B:
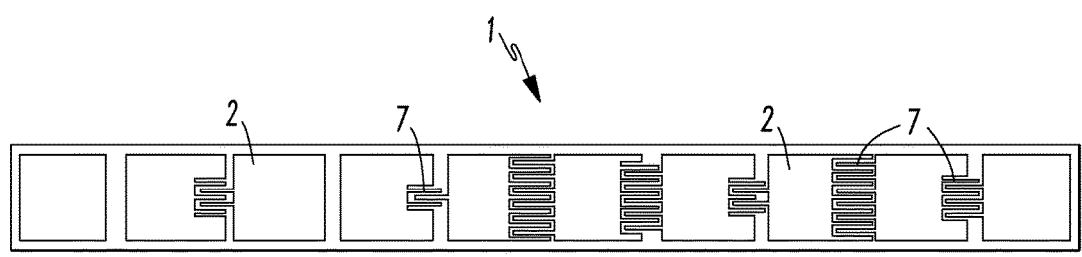
FIG. 6B is a top view of the exemplary embodiment of the EBG structure shown in FIG. 6A.

As noted above, scattering elements may utilize different structures. For instance, instead of capacitors the scattering elements may be interdigitated metallic structures 7 positioned between the unit cells 2 as shown in FIGS. 6A and 6B. The interdigitated metallic structures are positioned to create a capacitive load between the unit cells. The advantage to this is that the EBG structure can be printed at the same time as the patches, significantly reducing manufacturing time and cost (e.g. no need to mount lumped element capacitors). In addition, the range of available capacitances is continuous unlike lumped elements. The only constraints on this method are the fabrication tolerances of the printing method and the maximum capacitance possible in the limited space between adjacent patches, which limit the range of capacitance.

Another embodiment of the method employs a superstrate with metallic patches on it. These metallic patches 9, like the interdigitated structures 7 discussed above, create additional capacitance between the unit cells. This also allows for continuous capacitance values and the range of possible values is larger than with the interdigitated structures 7. Using the superstrate capacitance method is also much easier on the design end because there are less parameters to tune and they have a more direct correlation to capacitance. Because the maximum possible capacitance is limited in both of the structures shown in FIGS. 6A-7B, they may be most useful for embodiments that are designed based upon a known targeted bandwidth of the final antenna system and this targeted bandwidth does not greatly exceed an octave.

Figure 5A:
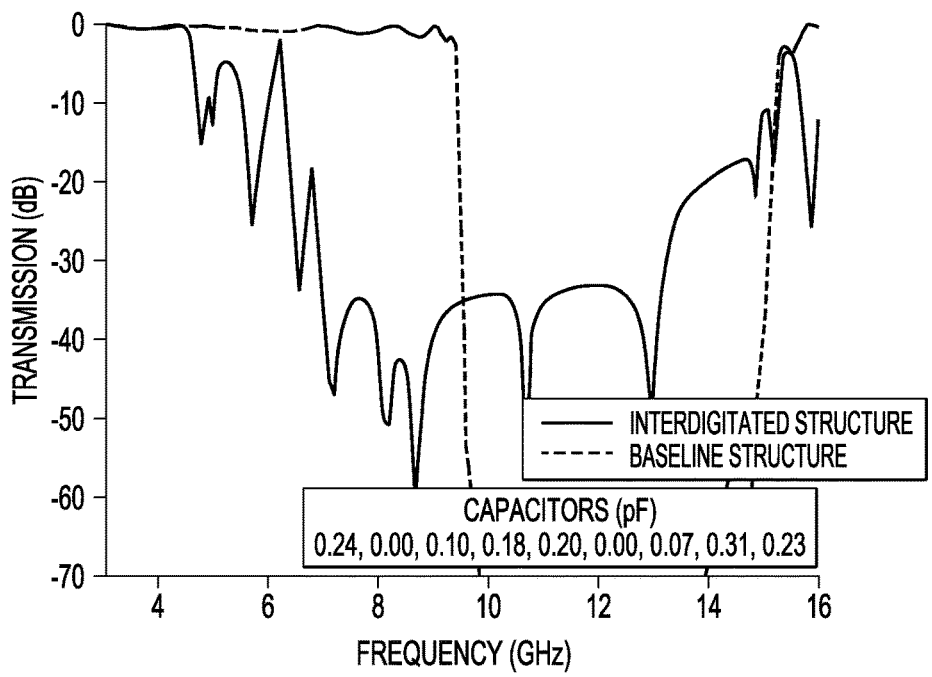
FIG. 5A is a graph illustrating a transmission response of an embodiment of our EBG structure. The embodiment of the EBG structure was configured as a broadband EBG structure that utilized interdigitated capacitors as illustrated in FIGS. 6A and 6B.
Figure 5B:
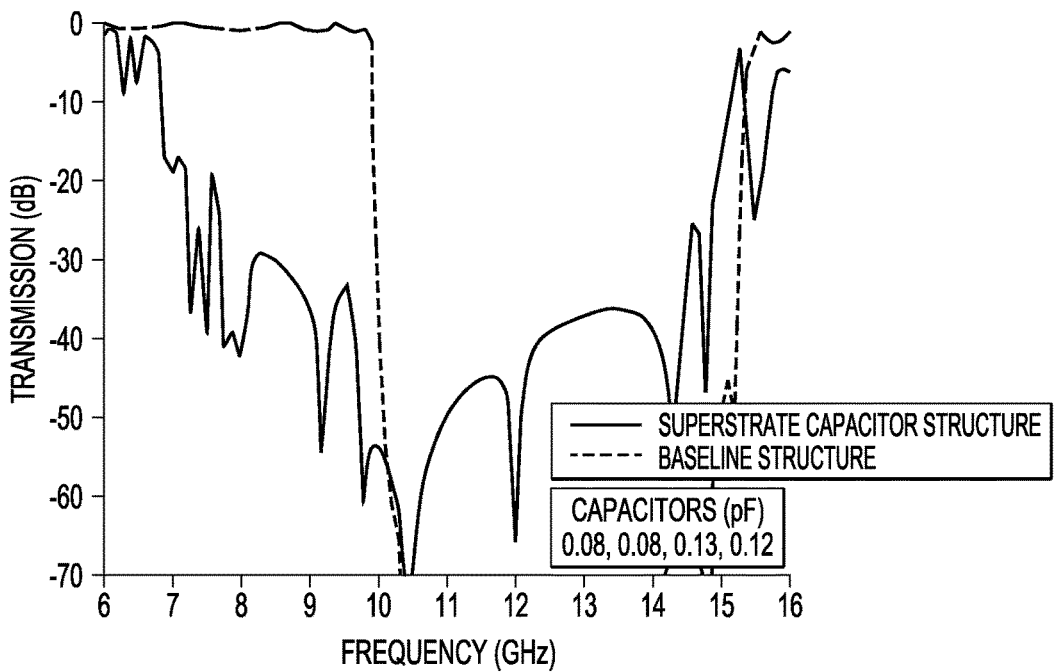
FIG. 5B is a graph illustrating a transmission response of an embodiment of our EBG structure. The embodiment of the EBG structure was configured to utilize superstrate capacitors as illustrated in FIGS. 7A and 7B.

The embodiments of FIGS. 6A through 7B may be utilized without the use of any lumped element capacitors. To utilize embodiments of the EBG structures illustrated in FIGS. 6A through 7B, the upper limit of the capacitance allowed in the optimization should be fixed to a value that can be created with one of the previously mentioned methods. An upper frequency limit must also be designated prior to optimization. With this, the size of the underlying structure can be determined and the optimization can be initiated. Results for structures designed with each of these methods compared to the response of the underlying structure prior to the addition of capacitors are shown in FIGS. 5A and 5B, with an image of the final EBG designs shown in FIGS. 6A-7B.

Figure 7A:
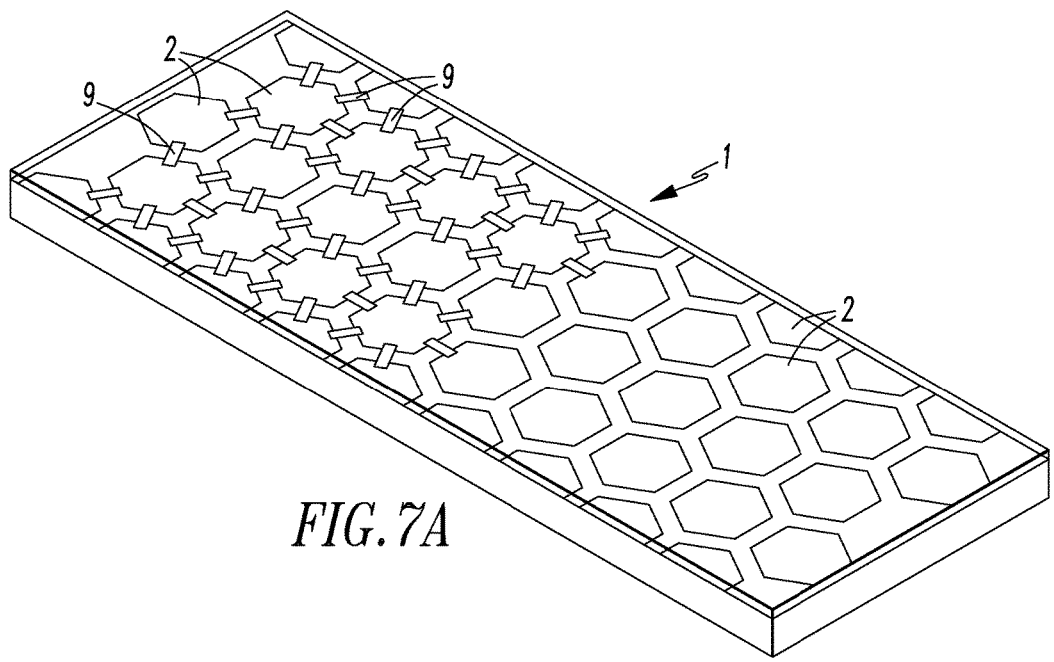
FIG. 7A is a perspective view an exemplary embodiment of an EBG structure utilizing superstrate capacitors
Figure 7B:
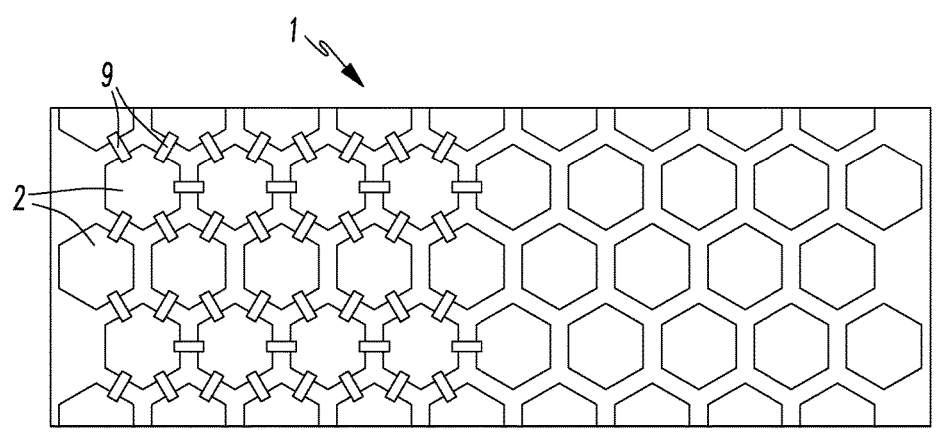
FIG. 7B is a top view of the exemplary embodiment of the EBG structure shown in FIG. 7A

It should be understood that the metallic patches 9 of the EBG design of FIGS. 7A and 7B are in or on a layer above the layer in which the unit cells 2 are positioned. The metallic patches 9 may be configured as capacitors, inductors or other types of scattering elements.

In the example of the interdigitated structure of FIGS. 6A and 6B, the goal was only for operation in a single direction. In the example of FIGS. 7A and 7B, a design objective of omni-directional band gap performance was targeted. The two designs in FIGS. 6A-6B and 7A-7B were optimized over a fixed frequency range, 7.5 to 15 GHz, and the depth of the band over that range was maximized. As can be seen, in both cases the bandwidth is notably larger than that of the underlying structure and the amount of suppression over the band is still in a range that would be considered extremely good.

Compared to the conventional cascaded unit cell designs, embodiments of our method and our structures results in a design of a more compact EBG structure because a unique structure with fixed capacitance values is not needed to cover each frequency range. Embodiments of our method also allows for more design flexibility.

One of the results shown here confirms a modestly deep stop band over an extremely wide bandwidth (e.g. 4:1), but other performance goals could also be targeted. Possibilities include broader, but shallower stop bands, deeper stop bands, multiple stop bands separated by a transmission region, or even stop bands that meet very specific dispersion characteristics. Embodiments of our method also allows for optimization of structures within a more complex environment with negligible increase in optimization time.

As another example of our method, we chose to design an exemplary embodiment of a parallel plate waveguide and discuss a number of exemplary embodiments of our method that may be utilized to design different embodiments of the waveguide below. The simulation size for our below discussed multi-band EBG structure embodiment is reduced by considering only one row of the structure and assuming periodic boundary conditions. This is a valid simulation when the only concern is for energy traveling in a single direction across the surface. The structure we have chosen for this multi-band example is a waveguide having twelve unit cells with additional capacitive loading between every element. The unit cells used as the underlying structure in this simulation have a periodicity of 7 mm, a separation between plates of 0.5 mm, a via radius of 12 mil, and the substrate is 1.52 mm thick Rogers RO3203, which has a permittivity of 3.02. A full-wave simulation of this structure takes approximately 45 minutes on a quad-core processor clocked at 3 GHz. This is important to keep in mind because the speed up provided by port substitution versus full-wave simulations is an important benefit for use of embodiments of our method. After the initial full-wave simulation of the 13-port network is completed, the scattering matrix is extracted which can then be used for the optimization of any desired goals. For all of our optimizations, we have used the CMAES. This method uses real-valued parameters and has proven effective at solving a wide range of problems with minimal user input.

Figure 10:
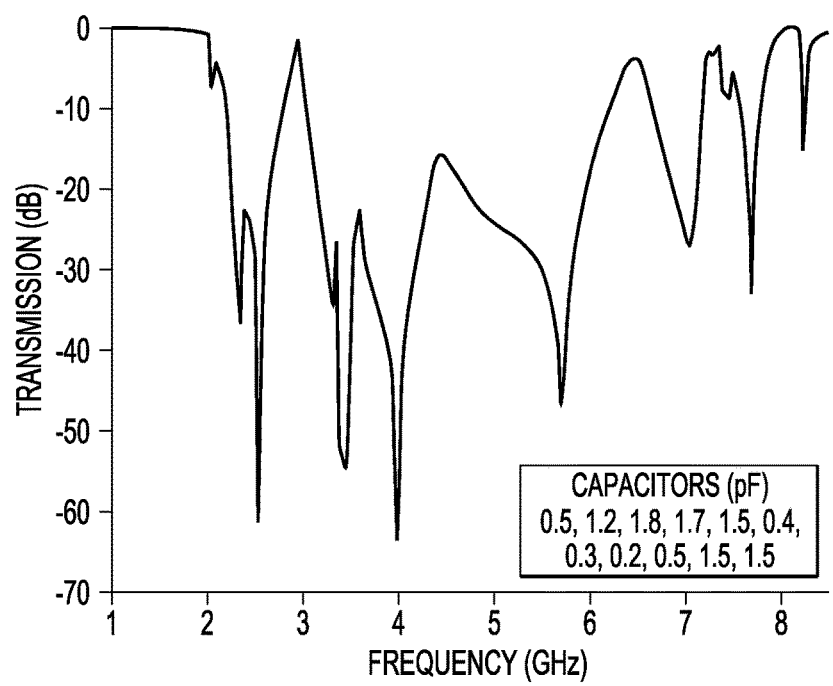
FIG. 10 is a graph illustrating the results of another exemplary optimization of an EBG structure.

The multi-band structure embodiment is configured to target three distinct frequency ranges. This type of design may be of use in a number of wireless communication settings (e.g. use as wireless access points, wireless routers, etc.) because wireless communications continue to demand higher speeds in compact environments, which can lead to a need for multi-band antennas in close proximity. A multi-band EBG structure can help reduce mutual coupling between these antennas, and thereby minimize the associated, negative effects. A full-wave simulation may be run first to obtain a scattering matrix for a thirteen port EBG structure as noted above. The cost function for this embodiment of an EBG structure is chosen to minimize the transmission at the 2.4, 3.6, and 5 GHz WLAN bands. To ensure that the full band is covered each of these bands was extended by 0.1 GHz at the top and bottom ends. In this case, a wider range of allowed capacitance values were used, but they were still limited to intervals of 0.1 pF, as can be seen in FIG. 10. This optimization resulted in the highest transmission in targeted bands. The results of this optimization can be seen in FIG. 10 and the set of capacitors that have been selected are shown in the "Capacitors (pF)" key included in FIG. 10 as well. The determined capacitors are 0.5 pF, 1.2 pF, 1.8 pF, 1.7 pF, 1.5 pF, 0.4 pF, 0.3 pF, 0.2 pF, 0.5 pF, 1.5 pF and 1.5 pF.

An embodiment of our method may also be utilized to design and make omnidirectional EBG structures. In order to accomplish this, capacitors may be placed on multiple sides of a unit cell. In order to run the initial full-wave simulation on an aperiodic structure with 10 square unit cells in each direction becomes an extremely large problem. To minimize this, hexagonal unit cells may be used, which can allow for less unit cells in the direction perpendicular to the length of the structure and the angle between directions of high symmetry is also reduced. Both of these make the design and simulation of the structure much faster.

Figure 11:
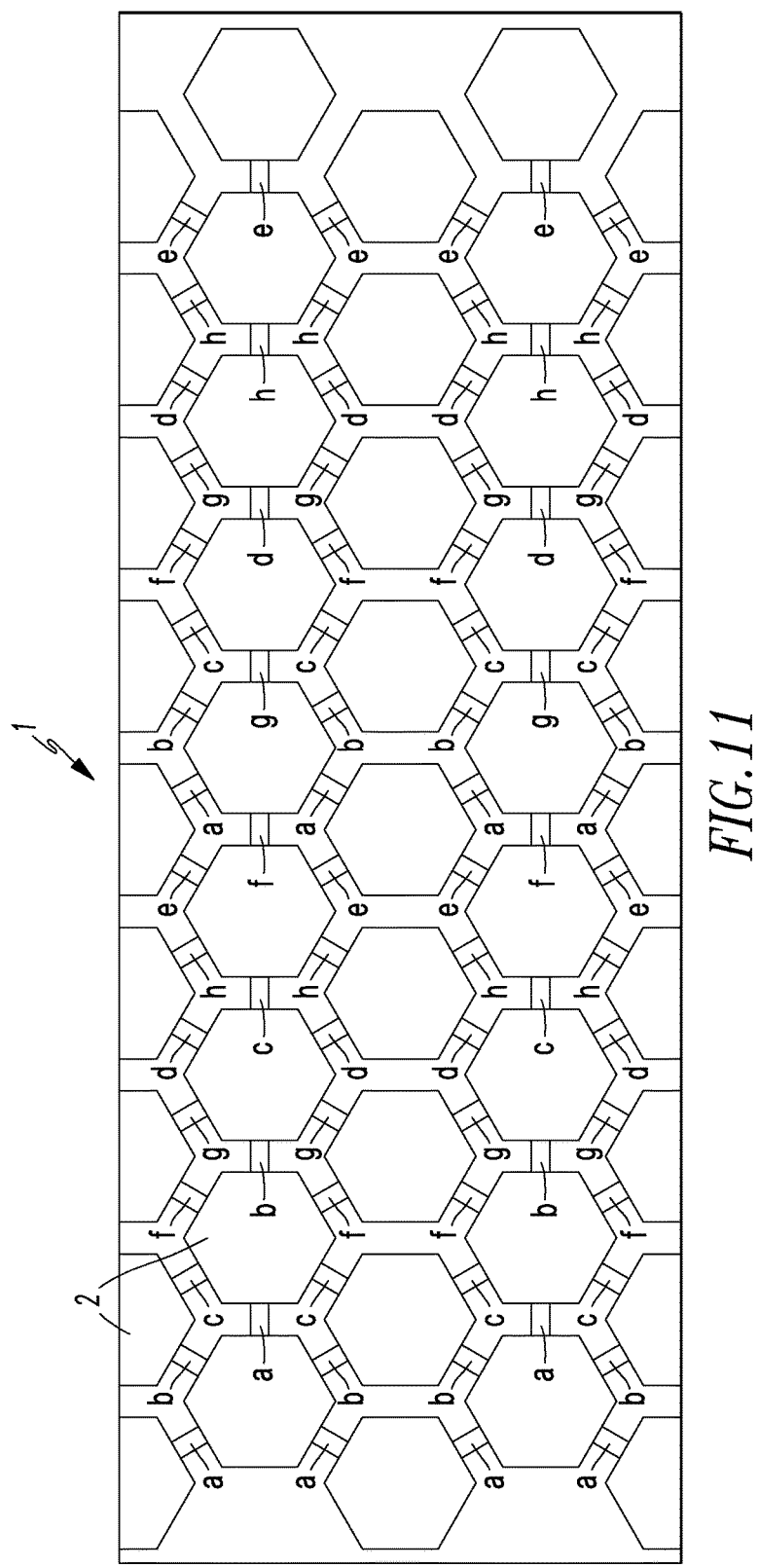
FIG. 11 is a top view illustrating another exemplary embodiment of the EBG structure.

The structure used for this optimization is shown in FIG. 11. The dielectric constant of the substrate for this particular embodiment is 3.02 with a thickness of 1.52 mm. The unit cells are 9 mm across, the patches are 7.25 mm, and the vias have a radius of 12 mil. Because of the large number of capacitors being substituted, a pattern was chosen to minimize the number of optimization parameters. In FIG. 11, all of the capacitors are identified with a reference letter a, b, c, d, e, f, g, or h. Each of these letters corresponds to a capacitor having a single unique capacitance value (e.g. the capacitance for capacitors a differs from the capacitance for capacitors b, c, d, e, f, g, and h). This reduces the eighty independent capacitors shown to eight unique parameters. This capacitor configuration was chosen because it allows for the surface to have approximately the same set of capacitors whether the energy is traveling straight across the surface or 60 degrees from this axis. The only difference is that energy going straight across the surface will only see the full set of capacitors once, whereas energy traveling 60 degrees from this direction will see the full set of capacitors twice. This means that for similar performance in all directions, only two angles are needed to optimize this structure. The direction straight across is important because it is the worst case direction that is parallel to the capacitors. The other important angle is 30 degrees because this is the largest angle away from parallel to one of the sets of capacitor.

Figure 12:
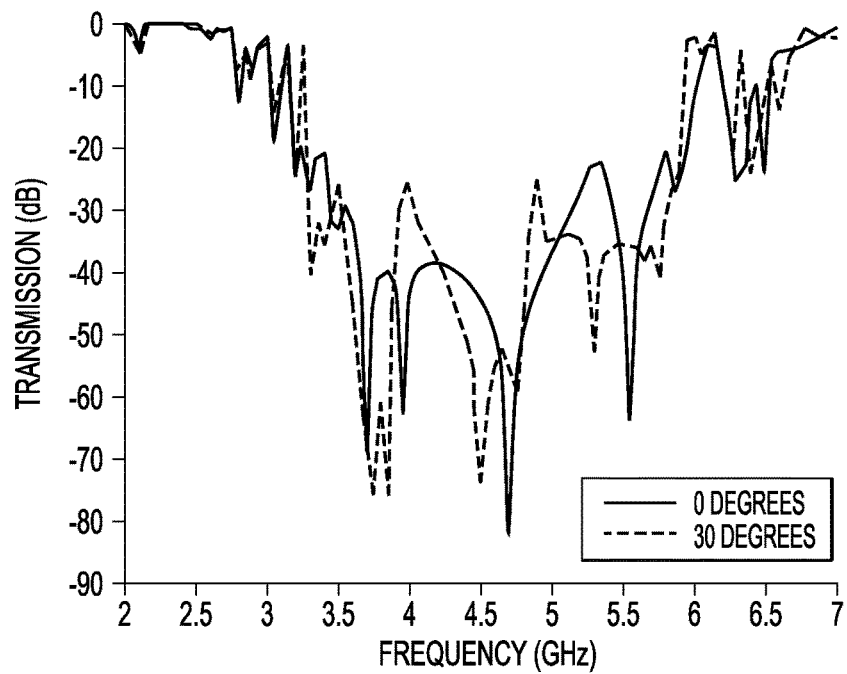
FIG. 12 is a graph of illustrating the results of an optimization of the EBG structure of FIG. 11.

Using capacitance values ranging from 0.1 to 1 pF, an optimization targeting maximum bandwidth for the 0 degree angle and transmission suppression over this band for 30 degrees was run. The results of this optimization are shown in FIG. 12. This structure without additional capacitive loading has a band gap between 4.8 and 6.1 GHz. Again transmission below −20 dB was used to define the bandwidth in this case and the final stop band for this structure with capacitive loading was between 3.25 GHz and 5.95 GHz. In this structure, notably fewer capacitors were used than in the previous optimizations, which means that the bandwidth enhancement is not as large. This could easily be overcome if several more patches were added. Another limitation of this setup is the symmetry imposed by reducing this problem to 8 unique capacitor values. If this is removed it is will no longer be possible to only simulate in the two directions, but it would also allow for the surface properties in different directions to be tuned individually. The downside, of course, is that this would greatly increase optimization time because five or more simulations would have to be considered.

As another example, we will consider the transmission across a structure with an open top boundary. For this example, we will use the same unit cell dimensions as we did as noted above. The only difference in the test setup is that the additional layer, needed to form a parallel-plate waveguide, has been removed. Ideally, the simulation used to represent this test setup will only use a single row of twelve unit cells, like the previous simulation did. For this particular embodiment, the simulation setup consisted of TEM waveports at the edges of one row of the structure in free space with infinite periodicity in the transverse directions. Using this test setup, an EBG structure with 25 unit cells was simulated via a full wave technique with ports between each of the patches. This results in 24 positions where additional capacitive loading could be implemented. Using this structure, three separate optimizations were completed. The first was again the enhancement of the bandwidth, the second lowered the transmission at two WLAN frequency bands, and the third targeted these same two frequency bands, but instead used tunable capacitors.

Figure 13:
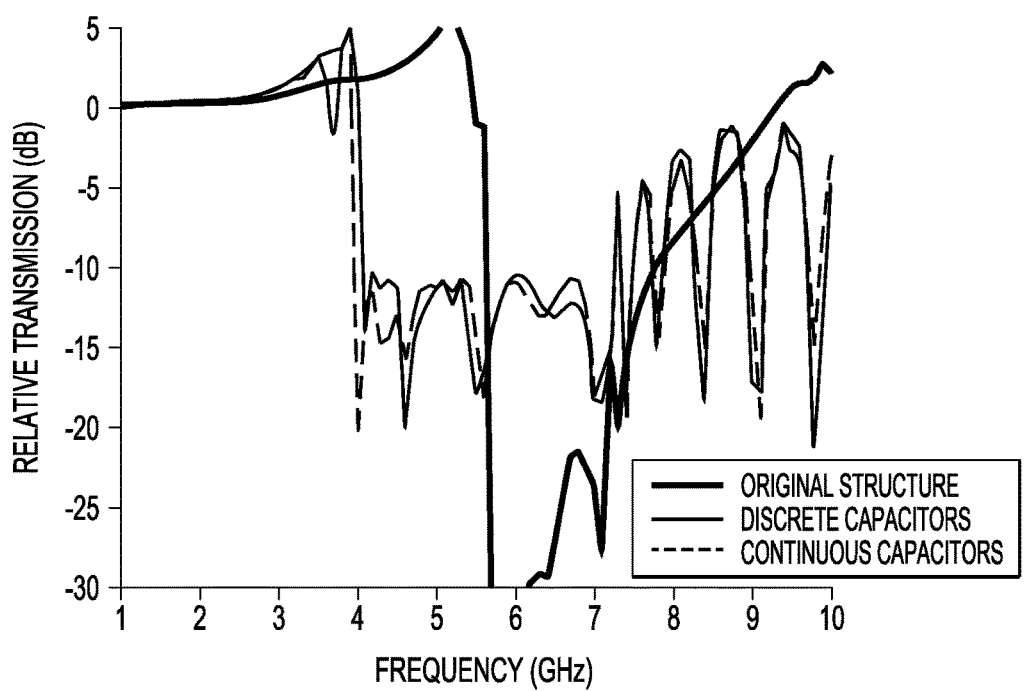
FIG. 13 is a graph illustrating the results of yet another exemplary optimization of an EBG structure utilizing two different types of capacitors as compared to an original structure.
Figure 14:
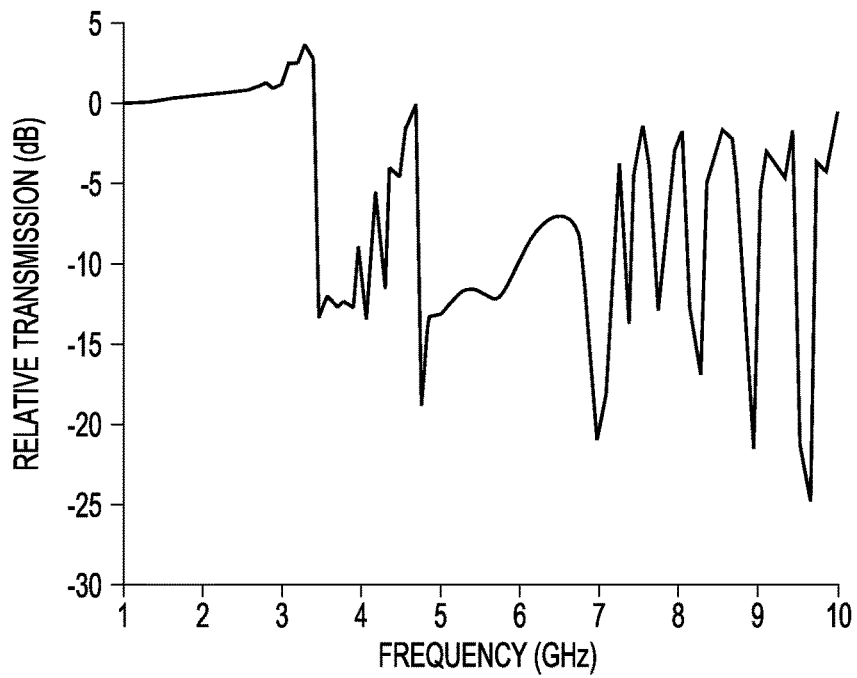
FIG. 14 is a graph illustrating the results of yet another exemplary optimization of an EBG structure.
Figure 15:
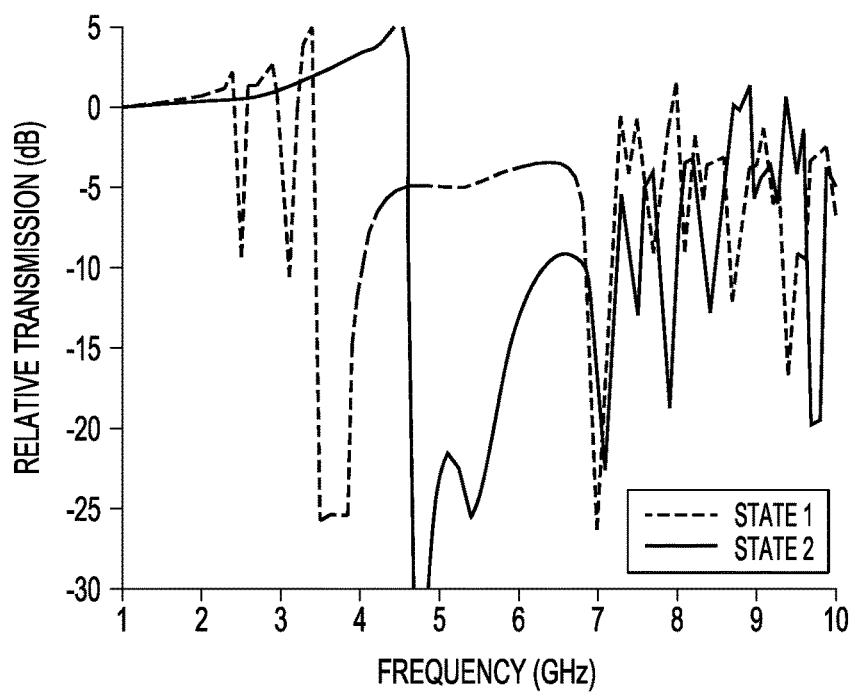
FIG. 15 is a graph illustrating the results of yet another exemplary optimization of an EBG structure.

The results from these three optimizations can be seen in FIGS. 13-15. In FIG. 13, a comparison of the transmission of an original non-optimized structure is compared with two optimized structures—one utilizing discrete capacitors and another utilizing continuous capacitors. It should be understood that all of the values have been normalized to the probe-to-probe transmission when the EBG structure is not present. The difference between the two optimized structures is the allowed capacitor values. In the discrete case, the capacitors were rounded to 0.1 pF values to ensure that they could be readily purchased. The continuous capacitor case corresponds to the structure when no such limit is imposed on the capacitor values. As may be understood from FIG. 13, the continuous-valued capacitors performs better than the discrete-valued case, but the improvement is minimal which implies that using real capacitors does not drastically limit the performance. It should also be noted that the depth of the band in this case corresponds to −10 dB because the surface wave is not as tightly bound to the surface so even the unoptimized structure does not exhibit extremely large isolation in this particular test environment. Using different test environments and materials can change all of the properties and therefore should be optimized accordingly.

The next two examples shown in FIGS. 14 and 15 both attempt to reduce the transmission between the two monopoles in the 3.6 and 5 GHz WLAN bands. The first of these examples attempts to isolate the two probes at both frequencies simultaneously, whereas the second uses variable capacitors in order to target the upper and lower bands with two separate states. The results from the dual-band optimization, shown in FIG. 14 demonstrate improved isolation at each of the respective bands. As can be seen in FIG. 14, the upper band still exhibits some isolation that is a consequence of the underlying structure. In the future, these results could be further improved if the response of the underlying structure were designed to align more closely with the upper frequency band.

By using varactor diodes, which can change effective capacitance continuously from 1.1 pF to 0.14 pF when a voltage from 0 V to 10 V is supplied, the results shown in FIG. 15 are possible with this same underlying structure. Because every capacitor in the structure is focused on a single narrow band in each of the states, the isolation is greatly improved over the previous dual-band optimization.

Figure 16:
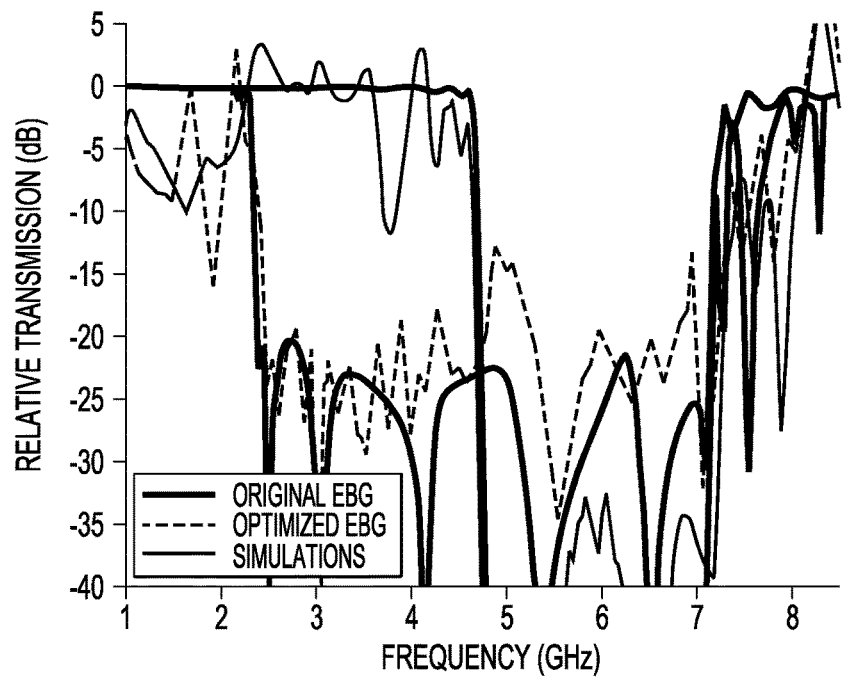
FIG. 16 is a graph illustrating the results of an optimization of a first EBG structure and how that optimization results compared to simulation results expected from the optimized embodiment.
Figure 17:
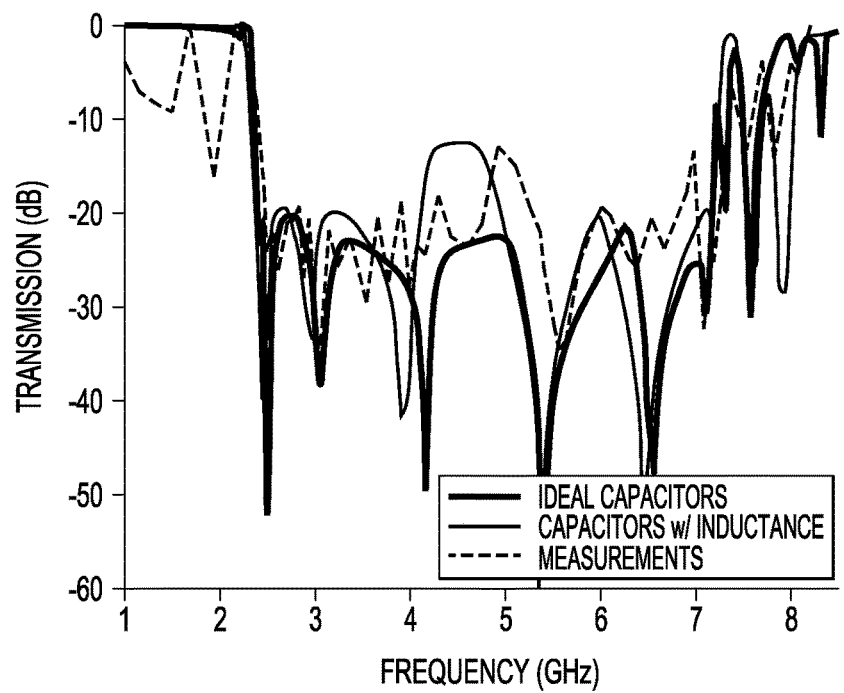
FIG. 17 is a graph illustrating simulated effects of adding inductance based on a manufacturer's data sheet for inductors utilized in the optimized first EBG structure evaluated in the graph of FIG. 16.
Figure 18:
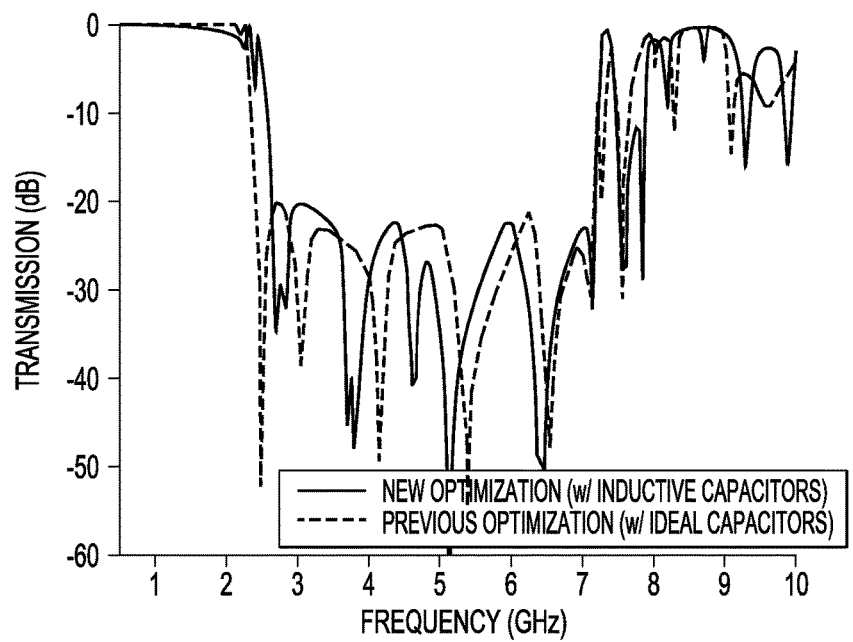
FIG. 18 is a graph illustrating a second optimized EBG structure as compared to the first optimized EBG structure shown in FIG. 16. It should be understood that the second optimized EBG structure was simulated as including inductive capacitors while the first optimized EBG structure was simulated as using ideal capacitors.

In order to confirm that our method works in practice as well as we expected it to work, we built an exemplary embodiment of an EBG structure as a waveguide. A similar structure without additional capacitive loading was also built in order to draw a direct comparison. To measure the transmission properties, we placed another grounded dielectric against the structures, which allowed the parallel plate spacing to be similar to that in the simulations. Energy was coupled into the waveguide with small monopole probe feeds. In order to mitigate the negative effects due to the finite size in the transverse direction, absorbing material was placed at the edges of the structure. FIG. 16 shows the comparison of the simulated and measured results for both the original and optimized mushroom-like structures. The measured results have been normalized to the measurements when no structure is present. Overall, the measurements and simulations match very closely for both structures. The only appreciable difference between simulation and measurement is present in the middle of the stop band for the optimized case; there is a small peak at that point. After several additional measurements and simulations, we believe that this minor discrepancy is caused by a non-ideal series inductance present in all capacitors. That is, as the self-resonance is approached for this sub-circuit, the capacitor no longer behaves ideally. The circuit being substituted into each of the ports does not necessarily have to be only a capacitor and in this case it is possible to add the inductor to the capacitor to achieve a more accurate model. The inductance associated with each capacitor can be approximated from the self-resonant frequency information provided in the manufacturer's data sheet. By incorporating this data into the simulations, the previously optimized results show a sizable peak in the middle of the band. A comparison of the simulations with and without the inductance can be seen in FIG. 17. With this additional consideration in mind, the optimization was redone with the inductance included. The results of this second optimization can be seen in FIG. 18, and they have been compared to the results obtained earlier with ideal capacitors. As would be expected, the best performance attainable with these capacitors is more limited than it was before, but the performance degradation is negligible.

Figure 19:
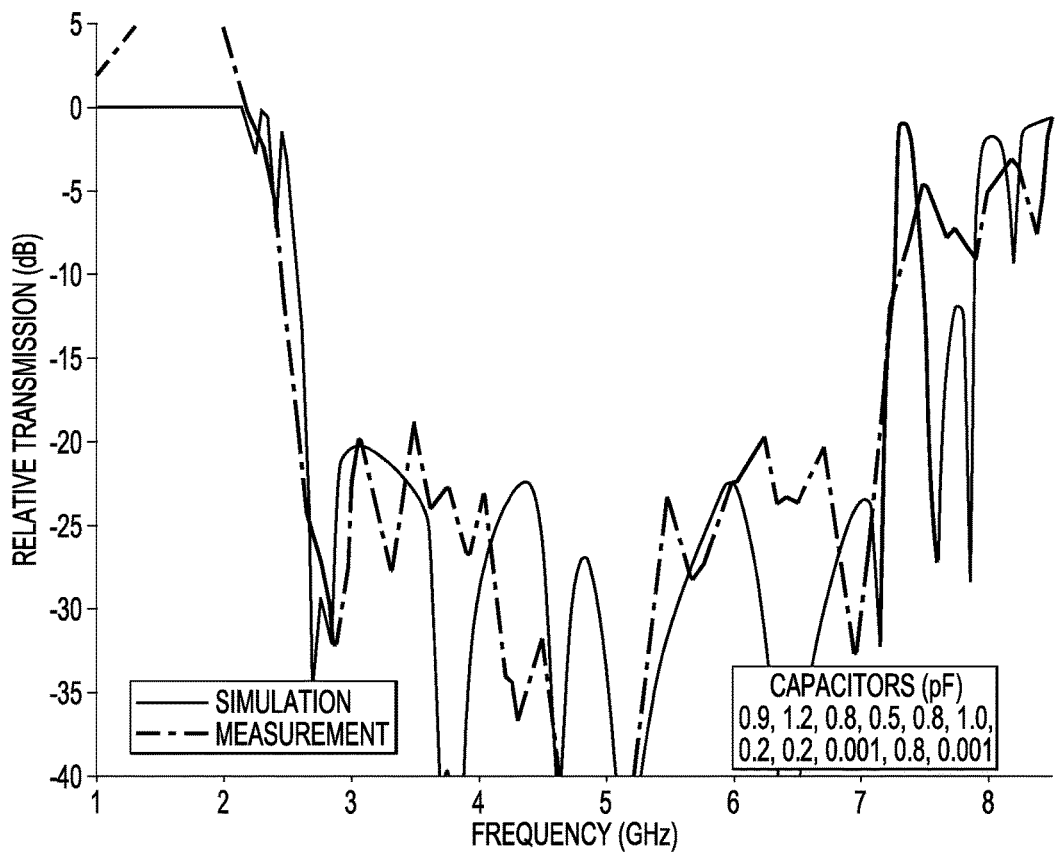
FIG. 19 is a graph illustrating the measured transmission across the second optimized EBG structure that included parasitic inductance and compares those measurements with simulation results. The key of FIG. 19 identifies the capacitance of different capacitors in the second optimized EBG structure.

In order to confirm these results, the second optimized EBG structure that included the inductance was also fabricated. The results can be seen in FIG. 19 along with the optimized capacitor values (set forth in the key included in FIG. 19). The bandwidth of the measured structure matches very closely with that of the simulation and only a few small peaks reach above −20 dB.

It should be appreciated that aperiodic capacitively-loaded EBG structures have been considered and a method to quickly calculate the loading necessary to meet a desired set of scattering parameters for an EBG structure is achievable via use of an embodiment of our method. Embodiments of our method may allow for a wide new range of possible transmission properties for EBG structures as may be appreciated from the above discussed examples.

It should be understood that while certain present preferred antenna systems and EBG structures and methods of making and using the same have been discussed and illustrated herein, the invention is not limited thereto but may be otherwise variously embodied and practiced within the scope of the following claims.

What is claimed is:
1. A method of making an electromagnetic band structure comprising a body defining a plurality of unit cells, each of the unit cells comprising a metallic patch, the method comprising:
    defining at least one scattering parameter for scattering elements by a scattering parameter process comprising:
        performing only a single full wave simulation with no other full wave simulations being performed to define the at least one scattering parameter;
        extracting a multiple port scattering matrix based on the single full wave simulation;
        estimating a transmission of waves across the body between a first port and a second port of the body based on the extracted multiple port scattering matrix, the body having multiple ports; and reducing the extracted multiple port scattering matrix to a two by two matrix recursively one dimension at a time; and making the electromagnetic band gap structure such that the body of the electromagnetic band gap structure has scattering elements, each scattering element of the electromagnetic band gap structure being positioned between at least two of the cells, each of the scattering elements of the electromagnetic band gap structure having at least one of the at least one scattering parameter defined via the scattering parameter process for providing a scattering effect between the cells.

2. The method of claim 1 wherein the scattering elements are configured to generate the scattering effect.

3. The method of claim 1 wherein the reducing the matrix to a two by two matrix recursively one dimension at a time utilizes a formula, the formula being:

$$S_{ij}^{(k)} = \frac{S_{ik}S_{kj}\Gamma_k}{1-S_{kk}\Gamma_k}$$

where $\Gamma_k$ is the reflection coefficient from a two-port circuit with the output pins shorted, $S_{ij}^{(k)}$ is an element of the new scattering matrix after substitution of a circuit defined by a respective one of the scattering elements, and remaining terms are elements of the scattering matrix before the substitution.

4. The method of claim 1 wherein the body has a plurality of apertures, each of the apertures being positioned between immediately adjacent unit cells so that the apertures space the unit cells from each other and wherein the scattering elements are each comprised of a metallic structure and each of the scattering elements is positioned in or adjacent a respective one of the apertures.

5. The method of claim 1 wherein the body has a plurality of gaps, channels or grooves that separate the unit cells, each gap, channel or groove being positioned between immediately adjacent metallic patches of immediately adjacent unit cells to space the metallic patches from each other and wherein the scattering elements are capacitors and each of the scattering elements is positioned in or adjacent a respective one of the gaps, channels or grooves.

6. The method of claim 1, wherein the computer is a server, a work station, a laptop computer, a tablet computer device, a mobile computer communicatively coupled to a server hosting a service, a computer communicatively coupled to a server hosting a service, a plurality of interconnected computer devices, or a desktop computer.

7. A method for making an electromagnetic band gap structure comprising:

performing only a single full wave simulation for the electromagnetic band gap structure using a computer to perform the simulation such that only the single full wave simulation is performed for making or designing the electromagnetic band gap structure and no other full wave simulations are performed to make or design the electromagnetic band gap structure;

extracting a multiple port scattering matrix based on the single full wave simulation using the computer;

measuring or estimating a transmission of waves across a body between a first port and a second port of the body, the body having multiple ports between the first port and the second port that are defined by scattering elements using the computer; and reducing the extracted multiple port scattering matrix to a two by two matrix recursively one dimension at a time using the computer; and making the electromagnetic band gap structure, the structure comprising the body and the scattering elements based on the measuring or estimating of the transmission of waves across the body and the reducing of the extracted multiple port scattering matrix.

8. The method of claim 7 wherein the reducing the extracted multiple port scattering matrix to a two by two matrix recursively one dimension at a time using a computer utilizes a formula, the formula being:

$$S_{ij}^{(k)} = \frac{S_{ik}S_{kj}\Gamma_k}{1-S_{kk}\Gamma_k}$$

where $\Gamma_k$ is the reflection coefficient from a two-port circuit with the output pins shorted, $S_{ij}^{(k)}$ is an element of the new scattering matrix after substitution of a circuit defined by a respective one of the scattering elements, and remaining terms are elements of the scattering matrix before the substitution.

9. The method of claim 8 wherein the body defines a plurality of unit cells; and wherein each of the scattering elements is positioned between two of the unit cells to create a capacitive load between the cells the scattering element is positioned between.

10. The method of claim 9 wherein the estimating of the transmission of waves across the body between the first port and the second port is performed based on the extracted multiple port scattering matrix and each of the scattering elements has at least one scattering parameter.

11. The method of claim 9 wherein the body has a plurality of apertures, each of the apertures being positioned between immediately adjacent unit cells so that the apertures space the unit cells from each other and wherein the scattering elements are each comprised of a metallic structure and each of the scattering elements is positioned in or above a respective one of the apertures.

12. The method of claim 9 wherein the body has a plurality of gaps, channels or grooves that separate the unit cells, each gap, channel or groove being positioned between immediately adjacent unit cells to space the unit cells from each other and wherein the scattering elements are capacitors and each of the scattering elements is positioned in or above a respective one of the gaps, channels or grooves.

13. The method of claim 9 further comprising including the electromagnetic band gap structure in an antenna system.

14. The method of claim 9 wherein the body has a plurality of gaps, channels or grooves that separate the unit cells, each gap, channel or groove being positioned between immediately adjacent unit cells to space the unit cells from each other and wherein the scattering elements are inductors and each of the inductors is positioned in or above a respective one of the gaps, channels or grooves.

15. The method of claim 9 wherein the body has a plurality of gaps, channels or grooves that separate the unit cells, each gap, channel or groove being positioned between immediately adjacent unit cells to space the unit cells from each other and wherein the scattering elements are selected from the group consisting of active circuits, interdigitated metallic structures, metallic patches, inductors, capacitors, multi-element circuits, and combinations thereof and each of the scattering elements is positioned in or above a respective one of the gaps, channels or grooves.

16. The method of claim 8 wherein the computer is a server, a work station, a laptop computer, a tablet computer device, a mobile computer communicatively coupled to a server hosting a service, a computer communicatively coupled to a server hosting a service, a plurality of interconnected computer devices, or a desktop computer.

17. The method of claim 8 wherein the estimating of the transmission of waves across the body between the first port and the second port is performed based on the extracted multiple port scattering matrix and the method is performed such that a full wave simulation is not performed after the single full wave simulation is performed using the computer.

18. The method of claim 7 wherein the estimating of the transmission of waves across the body between the first port and the second port is performed based on the extracted multiple port scattering matrix and the reducing of the extracted multiple port scattering matrix to a two by two matrix is performed utilizing a port substitution technique such that only the single full wave simulation is performed and no other full wave simulations are performed to design the electromagnetic band gap structure.

19. The method of claim 9 wherein the reducing of the extracted multiple port scattering matrix to a two by two matrix is performed utilizing a port substitution technique such that only the single full wave simulation is performed and no other full wave simulations are performed to design the electromagnetic band gap structure.

* * * * *